US006380771B1

United States Patent
Nakagawa

(10) Patent No.: US 6,380,771 B1
(45) Date of Patent: Apr. 30, 2002

(54) METHOD OF DRIVING POWER CIRCUIT AND CIRCUIT THEREFOR

(75) Inventor: Eiji Nakagawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/637,521

(22) Filed: Aug. 10, 2000

(30) Foreign Application Priority Data

Aug. 17, 1999 (JP) .............................................. 11-230313

(51) Int. Cl.[7] ................................................. H03K 3/00
(52) U.S. Cl. ....................................... 327/112; 327/540
(58) Field of Search ................................. 330/267, 262, 330/263, 271; 327/108, 111, 112, 538, 540, 541, 543; 326/82, 89, 90, 126, 127

(56) References Cited

U.S. PATENT DOCUMENTS

| | | | | |
|---|---|---|---|---|
| 4,331,930 A | * | 5/1982 | Shibata et al. ............... | 330/267 |
| 4,558,288 A | * | 12/1985 | Nakayama ................... | 330/268 |
| 5,015,887 A | * | 5/1991 | Tesch et al. .................. | 326/78 |
| 5,825,246 A | * | 10/1998 | Koifman et al. ............. | 330/267 |
| 5,977,829 A | * | 11/1999 | Wells .......................... | 330/267 |

* cited by examiner

Primary Examiner—Toan Tran
(74) Attorney, Agent, or Firm—Hogan & Hartson LLP

(57) ABSTRACT

A power drive circuit having push-pull type output transistors connected in series between power supplies. The power drive circuit comprises an idling loop for providing output transistors Q10 and Q12 with idling current based on a reference idling current which is increased or decreased in accordance with the currents flowing through the respective output transistors as detected by respective current detecting transistors Q13 and Q14. The invention prevents unnecessary oscillations in the circuit if the output current is very large, without resorting to an oscillation preventive capacitor, thereby enabling a cost saving power drive circuit.

5 Claims, 4 Drawing Sheets

METHOD OF DRIVING POWER CIRCUIT AND CIRCUIT THEREFOR

FIELD OF THE INVENTION

The invention relates to a method (referred to as power drive method) of driving a power drive circuit such as drivers for actuators including CDs (compact discs) and CD-ROMs and audio power amplifiers which require a large drive current tolerance, and to a circuit for the method.

BACKGROUND OF THE INVENTION

In a power drive circuit such as an actuator driver for a CD and a CD-ROM and an audio power amplifier, requiring a large drive current tolerance, bipolar transistors are used as an output element as well as a control element. These bipolar transistors are formed in the form of an integrated circuit (IC) chip together with other elements for the control circuit.

To alleviate some problems encountered in the manufacture of IC chips accommodating both NPN and PNP type bipolar transistors, NPN type bipolar transistors are configured to have a vertical structure in which operating current flows vertically, while PNP bipolar transistors are configured to have a lateral structure in which operating current flows laterally.

NPN bipolar transistors having vertical structures may have a large current tolerance, i.e. allows a large current through it, if it has a small chip area, whereas PNP bipolar transistors having lateral structures cannot, due to the fact that in the latter transistors electric current flow on or near the surfaces thereof under strong influences of the fields that exist on or near the surfaces. This implies that such PNP bipolar transistors have only a limited current amplification factor. In order to construct a PNP bipolar transistor having a large current tolerance, it is therefore necessary to provide the PNP bipolar transistor with a sufficiently large area on the chip, which is, however, a disadvantage from the point of manufacturing cost.

To circumvent this problem, there has been proposed a power drive circuit that utilizes NPN transistors not only as an output power transistor of the power drive circuit but also as a driver transistor for driving the output power transistor.

It is known that, in order to drive a push-pull type output power transistor without crossover distortions associated with it, it is necessary to maintain a constant idling current flowing through the output power drive circuit.

In a conventional power drive circuit as mentioned above, the idling current is normally set to a predetermined level large enough in suppressing any such crossover distortions. The idling current will be left at that level thereafter once it is set, irrespective of the magnitude of an input signal supplied to the power drive circuit or a load connected to the circuit.

However, in a conventional power drive circuit, it is likely that the idling loop falls in a resonating condition, which in turn causes resonation of the output circuit if the idling current has been set to a low level and a large load is connected to the power drive circuit. The resonance results in harmful influences such as erroneous operations of peripheral devices.

In order to prevent such resonance at all times, especially when a large load is connected, i.e. a large output current is required, the idling loop current must be set a high level, making a resonance margin wider. In this case, however, the raised idling current will result in unnecessary energy consumption in the circuit when the input signal has null or very low level.

One way to suppress the resonance of the idling loop is to provide a large capacitor in the idling loop. The capacitor, however, requires a fairly large area, so that the chip for the power drive circuit must be undesirably enlarged and can deteriorate frequency characteristics of the power drive circuit.

SUMMARY OF THE INVENTION

It is therefore an object of the invention to provide a power method of driving a power drive circuit free of resonance without any resonance preventive capacitor, thereby suppressing overall power consumption by the power drive circuit to a minimum level.

It is another object of the invention to provide a circuit to realize the method mentioned above.

In accordance with one aspect of the invention, there is provided a method (referred to as power drive method) of driving push-pull type output transistors connected in series between power supplies and operating in response to an input signal, said method comprising a step of controlling the idling current to be passed through the positive and negative sides of said output transistors in response to the level of the output current flowing through said output transistors.

In accordance with another aspect of the invention, there is provided a power drive circuit, comprising:

a positive side output transistor and a negative side output transistor connected in series between power supplies and performing push-pull operations;

an input circuit for receiving an input signal and, in response to said input signal, providing a drive signal to said positive and negative side output transistors;

an idling loop for providing an idling current to said positive and negative side output transistors in accordance with a reference idling current; and current detecting elements for detecting the drive currents flowing through said positive and negative side output transistors, wherein said reference idling current is changed in accordance with the detected levels of said drive currents to thereby controlling said idling loop.

Thus, the output transistors performing push-pull operations receive a minimum idling current when no input signal exists or only a low level input signal exists. The idling current will be increased when the output transistors are required to provide a large output current. Thus, the resonance margin of the idling loop is dynamically changed to stabilize the power drive circuit while improving overall cost performance of the drive circuit. It should be appreciated that the invention requires no resonance preventive capacitor having a large capacitor in the idling loop, so that the area required for the power drive circuit on an IC chip can be minimized, allowing not only cost-effective manufacture of the power drive circuit but also provision of desirable frequency characteristics to the circuit.

It is noted that the positive and negative side output transistors are both NPN bipolar transistors, and that both of them have their base and emitter connected with corresponding base and emitter of an associated current detecting NPN bipolar transistor, respectively, so that the reference idling current may be changed based on the current thus detected.

With this arrangement, the drive current (i.e. current through either of the output transistors) can be detected easily by means of the respective NPN current detecting transistors, and the detected current can be used directly in controlling the reference idling current.

It is also noted that the idling loop comprises a multiplicity of base-emitter passages of bipolar transistors, diodes, and resistors that receives current from the current detecting NPN bipolar transistors such that the reference idling current is changed based on the voltage drops across the resistors.

The reference idling current can be easily regulated by making the resistances of the resistors variable. Then the reference idling current can be automatically regulated by the drive current using the variable resistor.

DETAILED DESCRIPTION OF THE PREFERRED EMBODIMENT

Figure 1:
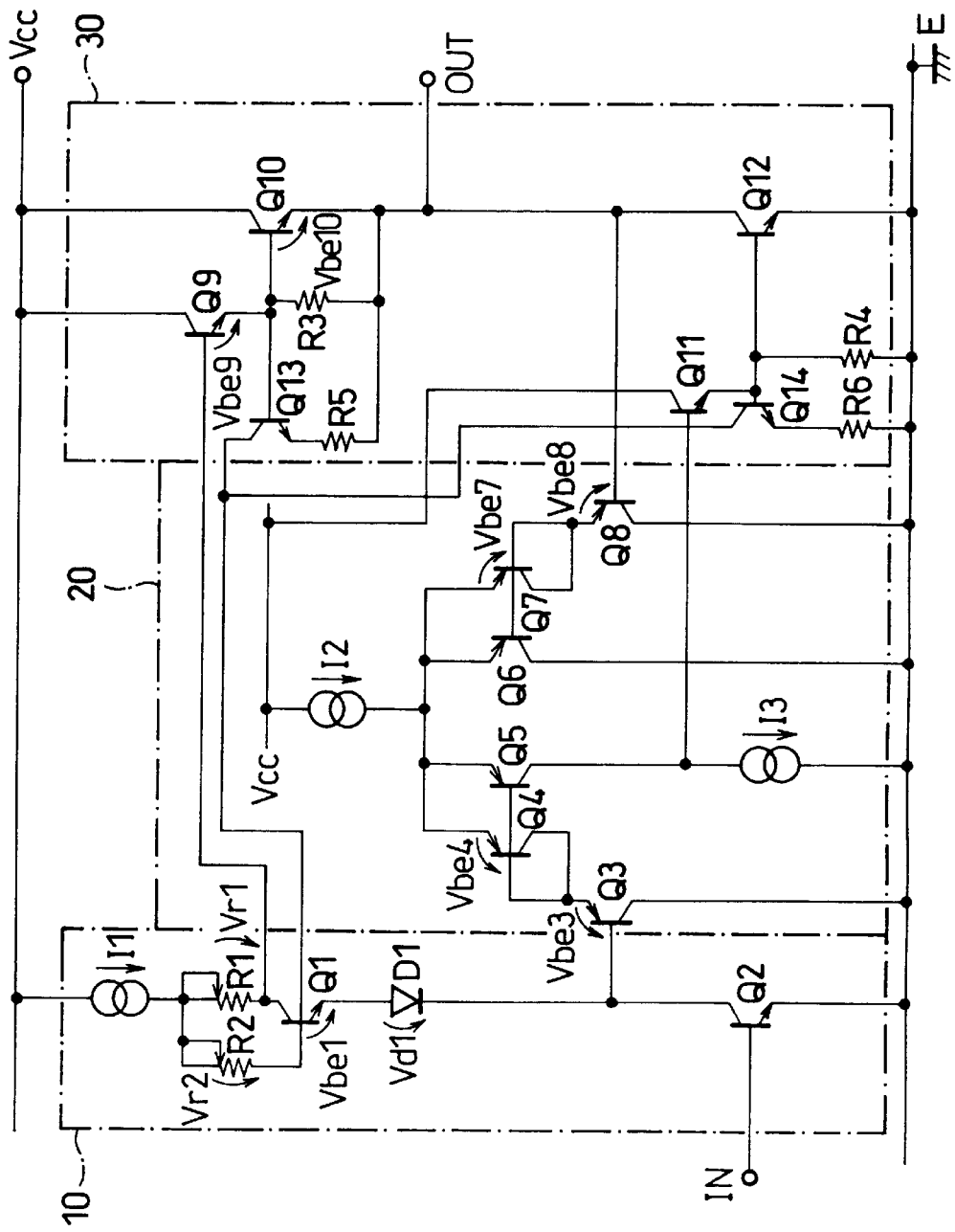
FIG. 1 is a schematic circuit diagram of a first power drive circuit according to the invention.

Referring now to FIG. 1, there is shown a first power drive circuit having an idling loop of the invention. The power drive circuit can be divided roughly into three sections as shown in FIG. 1. They are: an input means 10 for receiving input signals; an output means 30 for providing an output current to a load; and a current difference means 20 for controlling the output of the output means in response to the input.

The input means 10 includes a first constant current source I1, a first regulation resistor RI, NPN bipolar transistor Q1, a diode D1, and a signal input transistor Q2, all connected in series between a first supply voltage Vcc and a second voltage supply providing ground voltage E. A second regulation resistor R2 is connected to the base of the NPN bipolar transistor Q1 and to the node of the first constant current source I1 and the first regulation resistor R1. The first and the second regulation resistors RI and R2, respectively, are semi-fixed resistors, that is, resistors whose resistances can be adjusted to fixed magnitudes as they are released from a factory, so that the resistors can adjust voltage drops across various elements involved in the idling loop. The NPN bipolar transistor Q1 and the diode D1 are provided to form the idling loop.

Coupled with the base of the signal input transistor Q2 is an input signal supplied to an input terminal IN of the input means 10, which terminal has a DC electric potential between the supply voltage Vcc and the ground voltage E. As a result, the input terminal IN is fed with a DC bias and the potential of the output terminal OUT. Consequently, the input terminal IN is set to a DC voltage determined by the supply voltage Vcc and the voltage of the AC input signal superposed thereto.

The voltage of the node of the diode D1 and the signal input transistor Q2 is coupled to one input end of the current difference means 20, as described in detail later.

The current difference means 20 is formed of right and left difference circuit portions connected between the supply voltage Vcc and the ground voltage E via a second constant current source 12.

The left portion of the difference circuit includes a PNP bipolar transistor Q5 and a third constant current source 13 connected in series with the transistor Q5. The node of the transistor Q5 and the current source 13 forms one output end of the current difference means 20. The current difference means 20 also includes two PNP bipolar transistors Q3 and Q4 connected in series with each other. The emitter of the PNP transistor Q3 is connected with the bases of the transistors Q4 and Q5. The base of the transistor Q3 is further connected to the node of the diode D1 and the signal input transistor Q2 of the input means 10, the base of the transistor Q3 serving as one input end of the current difference means 20. The PNP bipolar transistors Q4 and Q5 are connected in parallel with each other, sharing the same base-emitter voltage, thereby forming a current mirror circuit.

The right portion of the difference circuit includes three PNP bipolar transistors Q6, Q7, and Q8 in such a way that the PNP bipolar transistor Q7 is connected in series with the PNP bipolar transistor Q8 and that the emitter of the PNP bipolar transistor Q8 is connected with the bases of the PNP bipolar transistors Q6 and Q7. The base of the PNP bipolar transistor Q8 forms the other input end of the current difference means 20, to be connected to the output terminal OUT of the output means 30. The PNP bipolar transistors Q6 and Q7 are connected together to share the same base-emitter voltage, forming another current mirror circuit.

The base-emitter passages of the PNP bipolar transistors Q3 and Q4 (or Q5), Q6 (or Q7) and Q8 constitute portions of the idling loop.

The output means 30 includes NPN bipolar transistors Q10 and Q12 connected in series with each other between the supply voltage Vcc and the ground voltage E. The node of these transistors is connected with the output terminal OUT. An NPN bipolar transistor Q9 is connected with an NPN bipolar transistor Q10 to form a Darlington connection, and so is NPN bipolar transistor Q11 with an NPN bipolar transistor Q12 to form another Darlington connection. A resistor R3 is connected between the base and the emitter of the NPN bipolar transistor Q10, and a resistor R4 is connected between the base and the emitter of the NPN bipolar transistor Q12.

The node of the first regulation resistor R1 and the NPN bipolar transistor Q1 of the input means 10 is connected to the base of the NPN bipolar transistor Q9 serving as the input end of the Darlington connection formed of the NPN bipolar transistors Q9 and Q10.

In a similar manner, the node of the PNP bipolar transistor Q5 of the current difference means 20 and the third constant current source 13 is connected to the base of the NPN bipolar transistor Q11 serving as the input end of the second Darlington connection formed of the NPN bipolar transistors Q11 and Q12.

In addition, the base-emitter path of an NPN bipolar transistor Q13 for current detection (referred to as current detecting NPN transistor) and a resistor R5 are connected between the base and the emitter of the NPN bipolar transistor Q10. The collector of the current detecting NPN bipolar transistor Q13 is connected to the base of the NPN bipolar transistor Q1. Similarly, the base-emitter path of a current detecting NPN bipolar transistor Q14 and a resistor R6 are connected between the base and the emitter of the NPN bipolar transistor Q12. The collector of the current detecting NPN bipolar transistor Q14 is connected to the base of the NPN bipolar transistor Q1.

The currents passing through the current detecting NPN bipolar transistors Q13 and Q14 are proportional to the current through the NPN bipolar transistors Q10 and Q12, respectively, and are passed through the second regulation resistor R2. Thus, the reference idling current for the idling loop is increased or decreased in proportion to the output current.

Hence, the drive currents through the output transistors, that is, NPN bipolar transistors Q10 and Q12, can be easily detected, detected currents available in the form of the output currents of the NPN bipolar transistors Q13 and Q14.

Incidentally, the push-pull amplifier circuit of the invention is a Class B amplifier, which suffers from crossover distortions arising from abrupt changes between positive and negative half waves across the time axis. In order to improve the level of the amplifier up to the level of Class AB by better smoothing the changes of the positive and negative waves, it is necessary to keep a proper level of idling current flowing through the output circuit at all times. To do this, an idling loop is provided in the form of a bias circuit, as described below.

When viewed from the output terminal OUT, the loop consists of the base-emitter path of the NPN bipolar transistor Q10, the base-emitter path of the NPN bipolar transistor Q9, the first regulation resistor R1, the second regulation resistor R2, the base-emitter path of the NPN bipolar transistor Q1, the diode D1, the base-emitter path of the PNP bipolar transistor Q3, the base-emitter path of the PNP bipolar transistor Q4, the base-emitter path of the PNP bipolar transistor Q7, and the base-emitter path of the PNP bipolar transistor Q8. It is noted that the NPN bipolar transistor Q12 receives its base current via the PNP bipolar transistor Q5 and NPN bipolar transistor Q11.

One will note that the circuit parameters of the transistors, diode, and resistors in the loop will satisfy the following identity (referred to as bias condition):

$$Vr2+Vbe1+Vd1-Vbe3-Vbe4+Vbe7+Vbe8-Vbe9-Vbe10+Vr1=0$$

where Vd1 is the forward voltage drop across the diode D1; Vbe1, Vbe3, Vbe4, Vbe7, Vbe8, Vbe9, and Vbe10 are the forward base-emitter voltage drops in the NPN bipolar transistor Q1, PNP bipolar transistors Q3, Q4, Q7, and Q8, respectively, and the NPN bipolar transistors Q9 and Q10, respectively; and Vr1 and Vr2 are the voltage drops across the first and the second regulation resistors R1 and R2, respectively. Temperature characteristics of these elements in the idling loop can be practically the same since they are integrated on the same small area on one chip.

By means of this idling loop, a proper level of idling current is provided to the loop via the output power transistors Q10 and Q12 even when there is no signal to the input terminal IN. It should be noted that the DC voltages at the input terminal IN and the output terminal OUT are held at intermediate levels between the supply voltage Vcc and the ground voltage potential E. Because a proper steady idling current is supplied to the power drive circuit when an input signal is supplied to the input terminal IN, distortions in the output signal of the power drive circuit will be then minimized.

It is known that in a push-pull type power drive circuit as mentioned above, undesirable oscillations can take place under a large load if the idling current is not sufficient.

Figure 2:
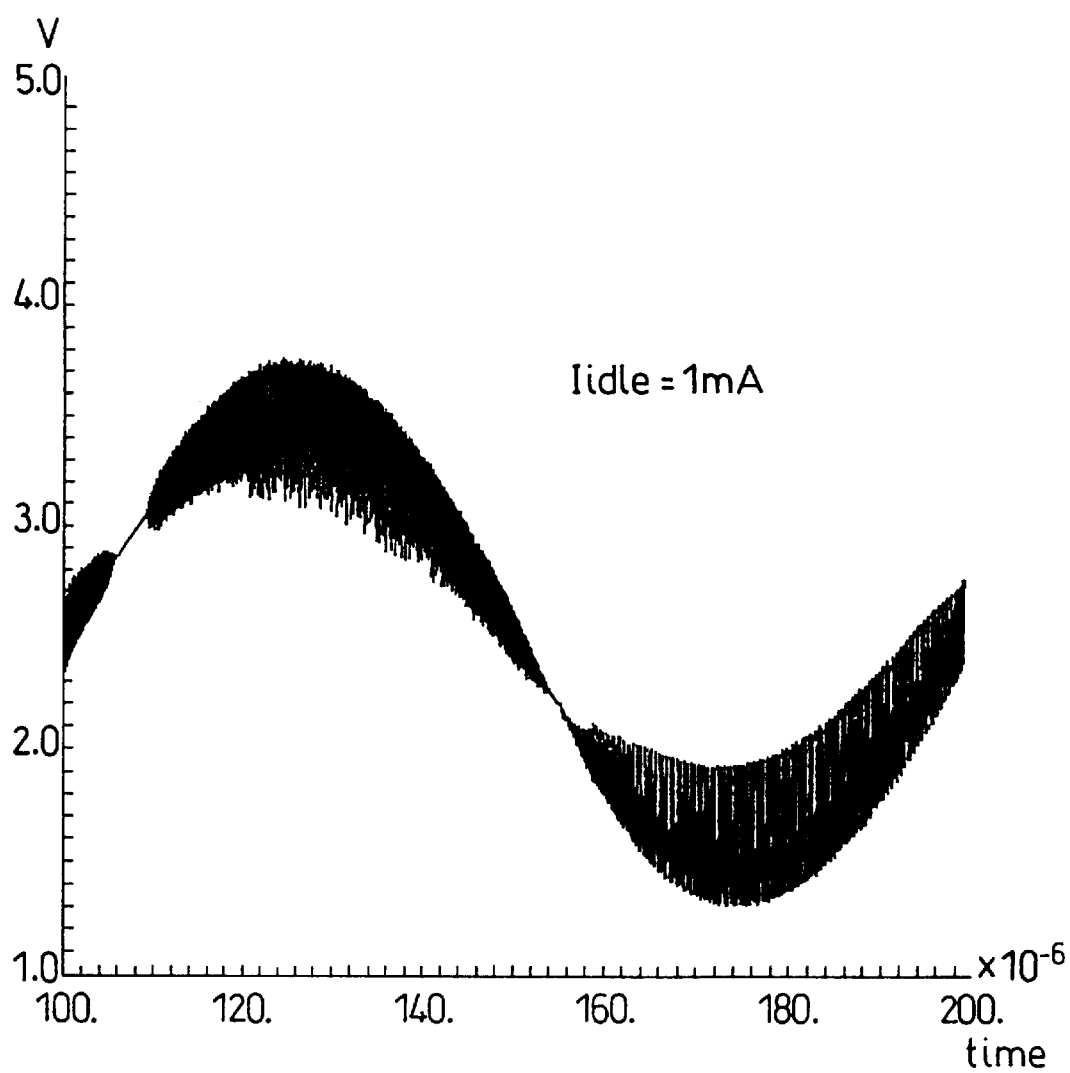
FIG. 2 is a graph showing the relationship between the idling current and the output current for a lower idling current, the graph showing some oscillations of the output current.
Figure 3:
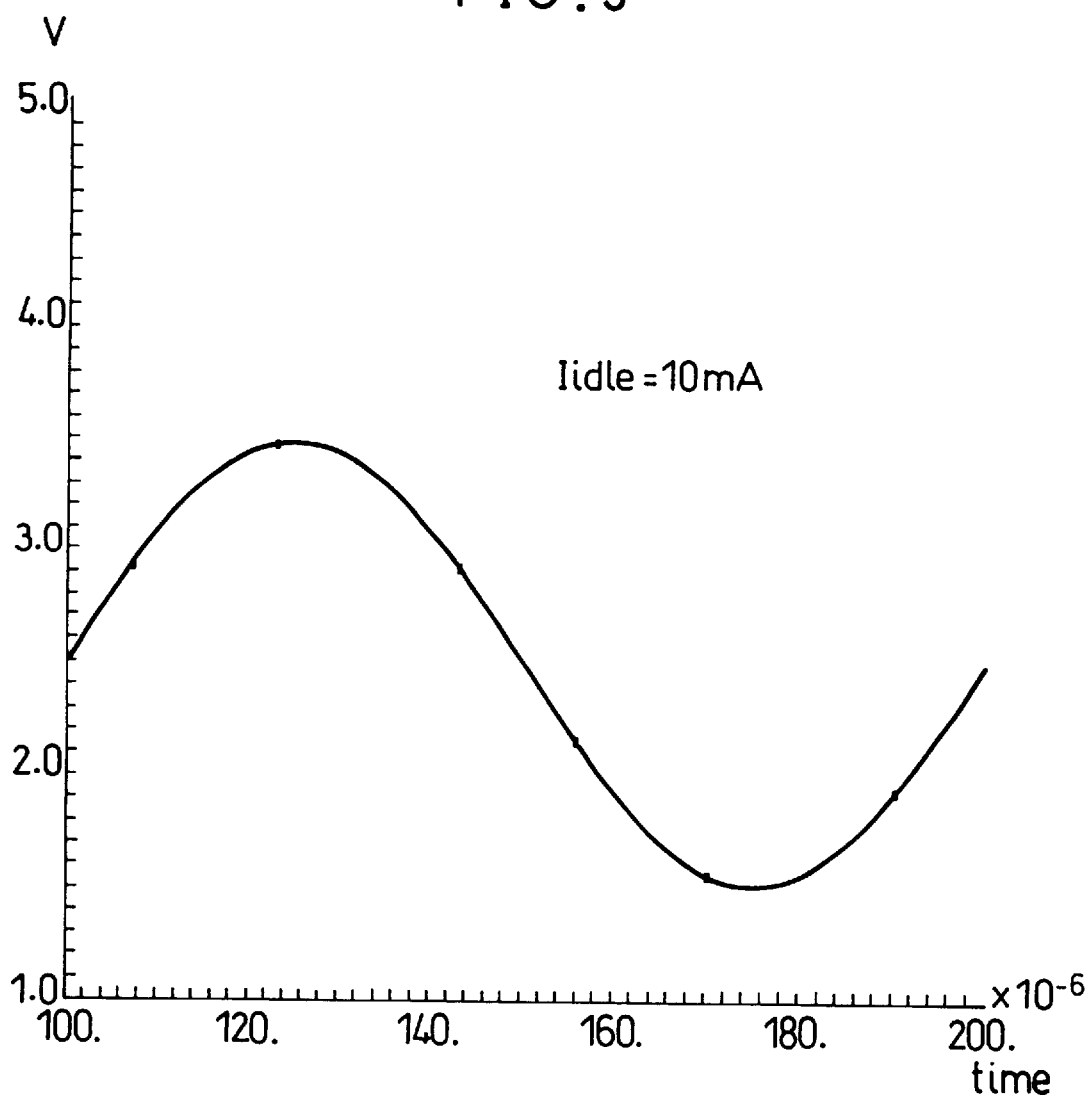
FIG. 3 is a graph showing the relationship between the idling current and the output current for a higher idling current.

Such oscillation can be seen in a power drive circuit of FIG. 1, for example, if the drive circuit had an ordinary constant current idling loop but had no current detecting NPN bipolar transistors Q13 and Q14. FIGS. 2 and 3 show results of simulations of such power drive circuit.

FIGS. 2 and 3 both show waveforms of a positive output of a BTL (Balanced Transformerless) power drive circuit operated for a large load (having resistance of 8 ohms and inductance of 47 mH).

In particular, FIG. 2 shows a case in which the idling current is 1 mA. It is seen from this Figure that if the idling current is less than 1 mA, the output will oscillate badly. It is also seen that the oscillation takes place and dies in association with the level of the output.

On the other hand, if the idling current is 10 mA as shown in FIG. 3, undesirable oscillation does not appear at all, yielding a clean waveform.

One sees that oscillations take place when the idling current is low. This is probably because the gain of the idling loop is then high and a peaking (a kind of self-resonance) can occur, thereby rendering the oscillation margin of the loop diminished.

In any event, as seen from these simulations, it is possible, even for a large load (i.e. large drive current), to prevent unnecessary oscillation by increasing the idling current in parallel with the output current.

In order to detect the current passing through the output power transistor Q10, the invention provides the aforementioned circuit configuration in which the base-emitter path of the current detecting NPN transistor Q13 and the resistor R5 are connected between the base and the emitter of the output power transistor Q10. Also, in order to detect the current through the output power transistor Q12, the base-emitter path of the current detecting NPN bipolar transistor Q14 and the resistor R6 are connected between the base and the emitter of the output power transistor Q12.

In this arrangement, a current flows through the current detecting NPN bipolar transistor Q13 in proportion to the current flowing through the output power transistor Q10, increasing the voltage drop Vr2 across the second regulation resistor R2.

As a result, if Vr2 is increased under the above described bias condition, $$Vr2+Vbe1+Vd1-Vbe3-Vbe4+Vbe7+Vbe8-Vbe9-Vbe10-Vr1=0,$$

Vbe3, Vbe4, Vbe9, and Vbe10 are increased accordingly.

Thus, the idling current will increase with the current through the output power transistor Q10, thereby preventing generation of undesirable oscillations.

Conversely, if the current through the output power transistor Q10 decreases, then the idling current will be decreased accordingly.

The relationship between the output power transistor Q10 and the current detecting NPN bipolar transistor Q13 as described above equally applies to the output power transistor Q12 and the current detecting NPN bipolar transistor Q14, so that the operation of the latter current detecting transistor is the same as the former one. Hence, further description for the latter will be omitted.

Coming back to FIG. 1, as a signal is input to the input terminal IN, it is superposed to the intermediate DC voltage of the input terminal, and amplified in the same manner as in ordinary power amplifiers, after which the signal is output to the load (not shown) connected with the output terminal OUT. The operating point of the idling loop will be shifted in accordance with the level of the signal input, irrespective of whether the signal input to the input terminal IN is positive upper half wave or negative lower half wave, causing the parameters in the bias condition, and hence the idling current, to be changed in accordance with the load current.

Since in the first exemplary power drive circuit shown in FIG. 1, the idling current is varied in accordance with the current passing through the push-pull output power transistors Q10 and Q12, unnecessary oscillations will be suppressed, which in turn suppresses overall energy consumption in the power drive circuit.

Because the push-pull output power transistors Q10 and Q12, and the transistors Q9 and Q11 driving these output transistors as well, are all NPN type bipolar transistors, requiring no oscillation preventive capacitor, so that the IC layout area of the chip can be minimized.

The use of the second variable regulation resistor R2 makes it easy to set up a reference idling current. In addition, by passing to the second regulation resistor R2, the current passing through the current detecting NPN bipolar transistors Q13 and Q14, the reference idling current is automatically changed in accordance with the level of the current passing through the output transistors Q10 and Q12.

Figure 4:
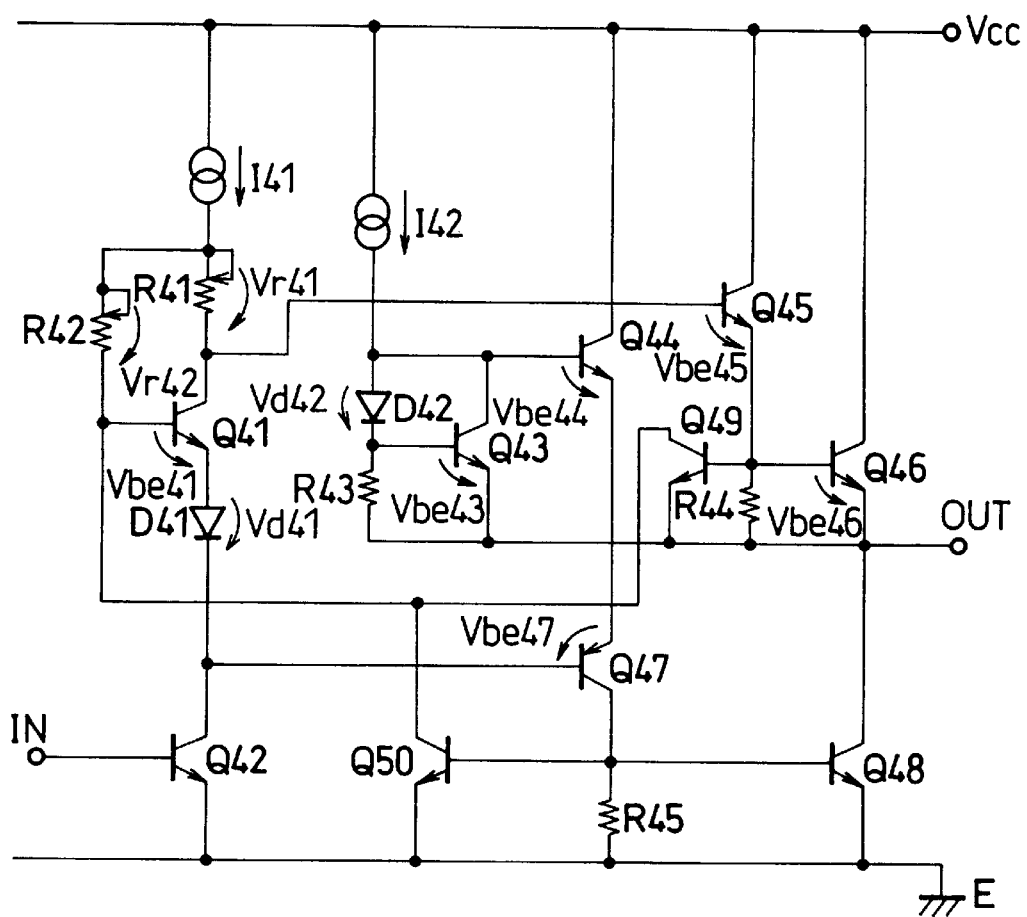
FIG. 4 is a schematic circuit diagram of a second power drive circuit according to the invention.

Referring now to FIG. 4, there is shown a second power drive circuit according to the invention.

A first constant current source I41, a first regulation resistor R41, an NPN bipolar transistor Q41, a diode D41, and a signal input transistor Q42 are connected in series between a first supply voltage Vcc and a second voltage supply providing ground voltage E, as shown in FIG. 4. Further, a second regulation resistor R42 is connected between the base of the NPN bipolar transistor Q41 and the node of the first constant current source I41 and the first regulation resistor R41. The first and the second regulation resistors R41 and R42, respectively, are semi-fixed resistors, so that they can regulate the voltage in a idling loop of the drive circuit. The NPN bipolar transistor Q41 and the diode D41 constitute the idling loop.

Input signals are input to the signal input terminal IN connected to the base of the signal input transistor Q42. The input terminal IN has an intermediate DC voltage between the power supply voltage Vcc and the ground voltage potential E, to which is superposed a DC bias voltage and a feedback voltage from the output terminal OUT.

Coupled between the supply voltage Vcc and the output terminal OUT is an NPN bipolar transistor Q43 via the second constant current source I42, and a diode D42 is coupled between the base and the collector of the transistor Q43, and a resistor R43 is coupled between the base and the emitter of the transistor Q43. Further, another NPN bipolar transistor Q44, a PNP bipolar transistor Q47, and a resistor R45 are connected in series between the supply voltage Vcc and the ground voltage E, such that the base of the transistor Q44 is connected to the collector of the transistor Q43, and the base of the transistor Q47 to the collector of the signal input transistor Q42. A further NPN bipolar transistor Q48 is connected between the output terminal OUT and the ground voltage E to serve as an output power transistor.

The NPN bipolar transistor Q45 and the resistor R44 are connected in series with each other between the supply voltage Vcc and the output terminal OUT, with the node of the transistor Q45 and the resistor R44 connected to the base of an NPN bipolar transistor Q46 serving as an output power transistor. The base of the NPN bipolar transistor Q45 is connected to the collector of the NPN bipolar transistor Q41.

The collector of a current detecting NPN bipolar transistor Q49 having its base and collector connected to the base and the emitter of the output power transistor Q46, respectively, and the collector of a current detecting NPN bipolar transistor Q50 having its base and emitter connected with the base and the emitter of the output power transistor Q48, respectively, are connected to the base of the NPN bipolar transistor Q41.

It is also necessary in the second power drive circuit to keep an idling current flowing through the output circuit in order to eliminate crossover distortions.

To do this, a bias circuit is formed to serve as an idling loop, as follows. When viewed from the output terminal OUT, the loop consists of the base-emitter path of the output power transistor Q46, the base-emitter path of the NPN bipolar transistor Q45, the first regulation resistor R41, the second regulation resistor R42, the base-emitter path of the NPN bipolar transistor Q41, the diode D41, the base-emitter path of the PNP bipolar transistor Q47, the base-emitter path of the NPN bipolar transistor Q44, the diode D42, and the base-emitter path of the NPN bipolar transistor Q43.

One will note again that the circuit parameters of the transistors, diode, and resistors in the loop will satisfy the following bias condition:

$$Vr42+Vbe41+Vd41-Vbe47-Vbe44+Vd42+Vbe43 \rightarrow Vbe46 \rightarrow Vbe45 \rightarrow Vr41=0$$

where Vd41 and Vd42 are forward voltage drops across the diode D41 and D42, respectively; Vbe46, Vbe45, Vbe41, Vbe47, Vbe44, and Vbe43 are the respective forward base-emitter voltage drops of the respective transistors in the loop; and Vr41 and Vr42 are the voltage drops across the first and the second regulation resistors R41 and R42, respectively. Temperature characteristics of these elements in the idling loop can be made practically the same since they are formed on a same small area of one IC chip.

By means of this idling loop, an appropriate idling current is provided to the output power transistors Q46 and Q48 even when there is no signal to the input terminal IN. In this example too, the input terminal IN and the output terminal OUT are held at intermediate the DC voltages between the supply voltage Vcc and the ground voltage potential E. Because a proper steady idling current is supplied to the power drive circuit when an input signal is supplied to the input terminal IN, distortions in the output signal of the power drive circuit will be then minimized.

As in the first example, undesirable oscillations can take place under a large load if the idling current is not sufficient in the second example. In order to prevent such oscillations, the idling current is increased in accordance with the level of the output current.

In the second example, therefore, the base-emitter path of the current detecting NPN bipolar transistor Q49 is connected between the base and the emitter of the output power transistor Q46 so as to detect the current passing therethrough. Similarly, the base-emitter path of the current detecting NPN bipolar transistor Q50 is connected between the base and the emitter of the output power transistor Q48 to detect the current passing therethrough.

In this arrangement, a current flows through the current detecting NPN bipolar transistor Q49 in proportion to the current flowing through the output power transistor Q46, increasing the voltage drop Vr42 across the second regulation resistor R42.

As a result, if Vr42 is increased under the above described bias condition $$Vr42+Vbe41+Vd41-Vbe47-Vbe44+Vd42+Vbe43-Vbe46-Vbe45-Vr41=0,$$

Vbe47, Vbe44, Vbe46, and Vbe45 are increased accordingly.

Thus, the idling current will increase with the current through the output power transistor Q46, thereby preventing generation of undesirable oscillations.

Conversely, if the current through the output power transistor Q46 decreases, then the idling current will be decreased accordingly.

The relationship between the output power transistor Q46 and the current detecting NPN bipolar transistor Q49 as described above equally applies to the output power transistor Q48 and the current detecting NPN bipolar transistor Q50, so that the operation of the latter current detecting transistor is the same as the former one. Hence, further description of the latter will be omitted.

Referring again to FIG. 4, as a signal is input to the input terminal IN, it is superposed to the intermediate DC voltage of the input terminal, and amplified in the same manner as in ordinary power amplifiers, after which the signal is output to the load (not shown) connected with the output terminal OUT. The operating point of the idling loop will be shifted in accordance with the level of the signal input, irrespective of whether the signal input to the input terminal IN is positive upper half wave or negative lower half wave, causing the parameters in the bias condition, and hence the idling current to be changed in accordance with the load current.

Since in the second power drive circuit shown in FIG. 4 the idling current is varied in accordance with the current passing through the push-pull output power transistors Q46 and Q48, unnecessary oscillations will be suppressed, which in turn suppresses overall energy consumption in the power drive circuit.

No capacitor is needed in preventing the aforementioned oscillations, so that the IC layout area of the chip can be minimized. It would be clear to a person of ordinary skill that other advantages obtained by the first example can be also obtained by the second example.

What I claim is:

1. A method (power drive method) of driving push-pull type output transistors connected in series between power supplies and operating in response to an input signal, said method comprising a step of controlling the idling current to be passed through the positive and negative sides of said output transistors in response to the level of the output current flowing through said output transistors, wherein the idling current increases when the output current flowing through one of the output transistors increases and the idling current decreases when the output current flowing through one of the output transistors decreases.

2. A power drive circuit, comprising:
    a positive side output transistor and a negative side output transistor connected in series between power supplies and performing push-pull operations;
    an input circuit for receiving an input signal and, in response to said input signal, providing a drive signal to said positive and negative side output transistors; and
    an idling loop for providing an idling current to said positive and negative side output transistors in accordance with a reference idling current, wherein
        said power drive circuit is adapted to detect the level of the current (referred to as drive currents) flowing through said positive and negative side output transistors and to change said reference idling loop in response to said detected drive currents, to thereby control said idling current, and
        the idling current increases when the drive currents flowing through either the positive side or the negative side output transistors increase and the idling current decreases when the drive currents flowing through either the positive side or the negative side output transistors decrease.

3. The power drive circuit as set forth in claim 2, wherein said positive side output transistor and said negative side output transistor are both NPN bipolar transistors.

4. The power drive circuit as set forth in claim 3, wherein a first base-emitter path of a first current detecting NPN bipolar transistor is connected between the base and the emitter of said positive side output transistor, and a second base-emitter path of a second current detecting NPN bipolar transistor is connected between the base and the emitter of said negative side output transistor to thereby change said reference idling current in accordance with the currents detected by said current detecting NPN bipolar transistors.

5. The power drive circuit as set forth in claim 4, wherein said idling loop comprises a multiplicity of base-emitter passages of bipolar transistors, diodes, and resistors such that the currents flowing through said current detecting NPN bipolar transistors are passed through said resistors and that the voltage drops across said resistors change said reference idling current.

* * * * *